US006778001B2

(12) United States Patent
Mayama et al.

(10) Patent No.: US 6,778,001 B2
(45) Date of Patent: Aug. 17, 2004

(54) SEMICONDUCTOR CIRCUIT COMPONENTS FOR SUPPLYING POWER TO A LOAD

(75) Inventors: Syuji Mayama, Nagoya (JP); Keizou Ikeda, Nagoya (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/058,306

(22) Filed: Jan. 30, 2002

(65) Prior Publication Data

US 2002/0123186 A1 Sep. 5, 2002

(30) Foreign Application Priority Data

Feb. 13, 2001 (JP) ........................................ 2001-035502

(51) Int. Cl.$^7$ ............................................ H03K 17/687
(52) U.S. Cl. ........................ 327/427; 327/109; 327/387; 323/265
(58) Field of Search .............................. 327/419, 425, 327/427, 432, 434, 109, 110, 387, 390, 389; 323/282, 265, 268, 271, 284, 289

(56) References Cited

U.S. PATENT DOCUMENTS

| 4,603,269 A | * | 7/1986 | Hochstein | .................. 327/432 |
| 4,691,129 A | * | 9/1987 | Einzinger et al. | ............ 327/434 |
| 4,928,053 A | * | 5/1990 | Sicard et al. | ................ 323/284 |
| 5,352,932 A | | 10/1994 | Tihanyi | ....................... 327/109 |
| 5,689,208 A | | 11/1997 | Nadd | .......................... 327/390 |
| 5,811,996 A | | 9/1998 | Oyabe et al. | ................ 327/110 |
| 5,936,390 A | | 8/1999 | Sicard | ......................... 323/282 |
| 6,169,431 B1 | * | 1/2001 | Xu | .............................. 327/109 |

FOREIGN PATENT DOCUMENTS

| DE | 195 15 417 A1 | 10/1996 |
| EP | 0 751 621 A1 | 1/1997 |

OTHER PUBLICATIONS

Kaifler, Erich and Tihanyi, Jeno, "Mini–Smart SIPMOS switches in SOT–223 packages: Small, smart, safe SMDs," Siemens Components, May/Jun. 29, (1994), No. 3, Berlin, Germany, pp. 11–15.

* cited by examiner

Primary Examiner—Minh Nguyen
(74) Attorney, Agent, or Firm—Oliff & Berridge, PLC

(57) ABSTRACT

A semiconductor circuit component has: an MOS-FET 12 which is a load-control semiconductor switching device with a control terminal; a control signal supply circuit 14 including a charging pump circuit for supplying a control signal to a gate G of the MOS-FET 12 to drive the MOS-FET 12; and a drive control circuit 16 for performing drive control only when a switch unit SW externally provided is turned on, so that a power supply voltage is supplied from a battery power supply to the control signal supply circuit 14 to thereby make the control signal supply circuit 14 output the control signal.

15 Claims, 6 Drawing Sheets

SEMICONDUCTOR CIRCUIT COMPONENTS FOR SUPPLYING POWER TO A LOAD

BACKGROUND OF THE INVENTION

The present invention relates to a semiconductor circuit component which can be driven when an externally provided switch unit is turned on so that a power supply voltage is supplied to the semiconductor circuit component.

A mechanical relay has been heretofore mainly used for the ON/OFF control of a power supply voltage supplied to an on-vehicle electrical component. That is, as shown in FIG. 6, a mechanical relay 101 has a relay coil 102, and relay contacts 103. One terminal T1 of the relay coil 102 is connected to a +B terminal of a battery power supply through a switch 104 while the other terminal T2 of the relay coil 102 is grounded. A terminal T3 of corresponding one of the relay contacts 103 is connected to the one terminal T1 of the relay coil 102 while a terminal T4 of the other of the relay contacts 103 is connected to one end of a load L 105 which has its other end grounded. In this relay circuit, when the power supply side switch 104 is turned on, the relay contacts 103 closed to drive the load 105.

There is another case where, as shown in FIG. 7, the one terminal T1 of the relay coil 102 is connected to the +B terminal of the battery power supply while the other terminal T2 of the relay coil 102 is grounded through a switch 106. Incidentally, the connection of the terminals T3 and T4 of the relay contacts 103 is the same as shown in FIG. 6. In this relay circuit, when the ground side switch 106 is turned on, the relay contacts 103 are closed to drive the load 105.

There is a further case where, as shown in FIG. 8, the one terminal T1 of the relay coil 102 is connected to the +B terminal of the battery power supply through a switch 107 while the other terminal T2 of the relay coil 102 is grounded through a switch 108. Also in this case, the connection of the terminals T3 and T4 of the relay contacts 103 is the same as shown in FIG. 6. In this relay circuit, when the power supply side switch 107 and the ground side switch 108 are turned on simultaneously, the relay contacts 103 are closed to drive the load 105. Incidentally, any one of the relay circuits is formed by mounting the mechanical relay 101 on bus bar terminals of a bus bar circuit board received in an electric connection box.

On the other hand, a semiconductor circuit component 109 having a switching function superior to that of the mechanical relay in terms of reduction in size and cost, and increase in reliability has been developed as schematically shown in FIG. 9 with the rapid advance of the semiconductor producing technique in recent years and has been used widely. The semiconductor circuit component 109 has an MOS-FET 110, and a control signal supply circuit 111 including a charging pump circuit for supplying a control signal to a gate G of the MOS-FET 110. A power input end 112 of the control signal supply circuit 111 and a drain D of the MOS-FET 110 are both connected to a first externally leading-out terminal T11, a ground end 113 of the control signal supply circuit 111 is connected to a second externally leading-out terminal T12, and a source S of the MOS-FET 110 is connected to a third externally leading-out terminal T13.

In the semiconductor circuit component 109 configured thus, a switching operation approximating that of the relay circuit shown in FIG. 6 can be made when, for example, the first externally leading-out terminal T11 is connected to the +B terminal of the battery power supply through a switch, the second externally leading-out terminal T12 is grounded and the third externally leading-out terminal T13 is connected to one end of a load having its other end grounded. Alternatively, a switching operation approximating that of the relay circuit shown in FIG. 7 can be made when the first externally leading-out terminal T11 is connected to the +B terminal of the battery power supply, the second externally leading-out terminal T12 is grounded through a switch and the third externally leading-out terminal T13 is connected to a load.

Alternatively, a switching operation approximating that of the relay circuit shown in FIG. 8 can be made when the first externally leading-out terminal T11 is connected to the +B terminal of the battery power supply through a switch, the second externally leading-out terminal T12 is grounded through a switch and the third externally leading-out terminal T13 is connected to a load. Accordingly, in any relay circuit, it may be considered that the semiconductor circuit component can be designed to take the place of the mechanical relay 101 directly without any substantial change of the circuit configuration of the bus bar circuit board.

In each of the switches 104, 105, 106, 107 and 108 externally provided as shown FIGS. 6, 7 or 8, leakage resistance, for example, of about 10 KΩ may be generated between contacts due to dew drops. In the case where the mechanical relay 101 is used as shown in each of FIGS. 6, 7 and 8, the mechanical relay 101 never operates with such a small value of leakage resistance because the current flowing in the relay coil 102 is too small. In the case of a circuit using the semiconductor circuit component 109, however, the circuit impedance generated between the first and second externally leading-out terminals T11 and T12 is considerably higher than the leakage resistance generated between the contacts of the switch. Accordingly, if leakage resistance is generated between the contacts of the switch connected to the first or second externally leading-out terminal T11 or T12 side due to dew drops, electrical conduction may be made substantially between the contacts of the switch as if the switch were turned on. As a result, there is a risk that the semiconductor circuit component 109 operates to allow the load 105 to malfunction. Hence, there was a problem that the semiconductor circuit component was difficult to take the place of the mechanical relay directly in the ON-OFF control circuit of the on-vehicle electrical component.

SUMMARY OF THE INVENTION

The invention is devised upon such circumstances and an object of the invention is to provide a semiconductor circuit component in which the operation of a load can be switched in response to the ON/OFF operation of a switch unit externally provided in the same manner as in the prior-art mechanical relay and in which the malfunction of the load caused by leakage resistance of the switch unit can be avoided.

(1) To achieve the foregoing object, in accordance with the invention, there is provided a semiconductor circuit component capable of being driven when an externally provided switch unit is turned on to thereby supply a power supply voltage to the semiconductor circuit component, the semiconductor circuit component having: a load-control semiconductor switching device with a control terminal; a control signal supply circuit for supplying a control signal to the control terminal of the load-control semiconductor switching device to thereby drive the load-control semiconductor switching device; and a drive control circuit for controlling drive in a manner so that, only when the switch unit is turned on, a power supply voltage is supplied from the drive control circuit to the control signal supply circuit to make the control signal supply circuit output the control signal.

In this configuration, only when the switch unit is turned on, the control signal supply circuit is driven to supply a control signal to the control terminal of the load-control semiconductor switching device to thereby make the load-control semiconductor switching device electrically conductive. For this reason, the control signal supply circuit is not driven even if leakage resistance is generated between contacts of the switch unit due to dew drops when the switch unit is not turned on. As a result, the load can be prevented from malfunctioning due to the externally provided switch unit, so that the semiconductor circuit component can take the place of the mechanical relay.

(2) Further, according to the invention, in the semiconductor circuit component as in (1), preferably, the drive control circuit is disposed between a power supply and a ground and in series with the switch unit, so that only when the switch unit is turned on, the power supply voltage is supplied from the drive control circuit to the control signal supply circuit.

In this configuration, only when the switch unit is turned on, the drive control circuit is supplied with the power supply voltage. Hence, the drive control circuit is driven to supply the power supply voltage to the control signal supply circuit.

(3) Further, according to the invention, in the semiconductor circuit component as in (2), preferably, the drive control circuit includes: a drive-control semiconductor switching device with a control terminal; and a voltage supply circuit for supplying a drive voltage to the control terminal of the drive-control semiconductor switching device when the switch unit is turned on and a power supply voltage having a rated value is supplied to the voltage supply circuit; and the drive-control semiconductor switching device performs drive control so that the power supply voltage is supplied from the drive-control semiconductor switching device to the control signal supply circuit when the drive voltage is supplied to the drive-control semiconductor switching device from the voltage supply circuit to drive the drive-control semiconductor switching device.

In this configuration, even if leakage resistance is generated between contacts of the switch unit due to dew drops when the switch is not turned on, a voltage drop occurs in the leakage resistance so that the power supply voltage having the rated value is not supplied to the voltage supply circuit. As a result, the drive-control semiconductor switching device is not made electrically conductive, so that the control signal supply circuit is not driven. Accordingly, the load can be prevented from malfunctioning due to the externally provided switch unit, so that the semiconductor circuit component can take the place of the mechanical relay.

(4) Further, according to the invention, in the semiconductor circuit component as in (3), preferably, the voltage supply circuit includes a voltage dividing circuit for dividing the power supply voltage supplied through the switch unit and a voltage suppressing circuit for suppressing a partial voltage into a predetermined value, the partial voltage being obtained by the voltage dividing circuit.

In this configuration, even if the power supply voltage with a large value is supplied from the battery power supply due to the turning on of the switch unit, a voltage having a predetermined value is supplied to the control terminal of the drive-control semiconductor switching device by the function of the voltage suppressing circuit so that the drive-control semiconductor switching device is made electrically conductive in a stable state. Further, in the case where leakage resistance is generated between contacts of the switch unit due to dew drops when the switch unit is not turned on, a voltage drop occurs in the leakage resistance so that only a power supply voltage having a small value is allowed to be supplied to the voltage dividing circuit and, further, the power supply voltage with the small value is divided. As a result, the drive-control semiconductor switching device is not made electrically conductive, so that the control signal supply circuit is not driven. Accordingly, the load can be prevented from malfunctioning due to the externally provided switch unit, so that the semiconductor circuit component can take the place of the mechanical relay.

(5) Further, according to the invention, in the semiconductor circuit component as in (3) or (4), preferably, the drive-control semiconductor switching device has one end connected to a ground end of the control signal supply circuit while the ground end is grounded through the other end of the drive-control semiconductor switching device, so that when a drive voltage is supplied to the drive-control semiconductor switching device from the voltage supply circuit to drive the drive-control semiconductor switching device, the power supply voltage is supplied from the drive-control semiconductor switching device to the control signal supply circuit.

In this configuration, when the drive voltage from the voltage supply circuit is supplied to the drive-control semiconductor switching device to drive the drive-control semiconductor switching device, the ground end of the control signal supply circuit is grounded to thereby supply the power supply voltage to the control signal supply circuit.

(6) Further, according to the invention, preferably, the semiconductor circuit component as in (5) further includes: a first externally leading-out terminal connected to a power input end of the voltage supply circuit while connected to the power supply through the switch unit; a second externally leading-out terminal connected to the other end of the drive-control semiconductor switching device while connected to the ground; a third externally leading-out terminal connected to one end of the load-control semiconductor switching device and to a power input end of the control signal supply circuit while connected to the power supply; and a fourth externally leading-out terminal connected to the other end of the load-control semiconductor switching device while connected to a load.

In this configuration, for example, the first and second externally leading-out terminals can be made to correspond to respective terminals at opposite ends of a relay coil, and the third and fourth externally leading-out terminals can be made to correspond to respective terminals at opposite ends of relay contacts. Hence, the semiconductor circuit component can take the place of the prior-art mechanical relay without any substantial change of the circuit configuration of the bus bar circuit board.

(7) Further, according to the invention, preferably, in the semiconductor circuit component as in (3) or (4), the drive-control semiconductor switching device has one end connected to a power input end of the control signal supply circuit while the power input end is connected to the power supply through the other end of the drive-control semiconductor switching device so that, when a drive voltage is supplied from the voltage supply circuit to the drive-control semiconductor switching device to drive the drive-control semiconductor switching device, the power supply voltage is supplied from the drive-control semiconductor switching device to the control signal supply circuit.

In this configuration, when a drive voltage from the voltage supply circuit is supplied to the drive-control semiconductor switching device to drive the drive-control semiconductor switching device, the power input end of the control signal supply circuit is connected to the power supply to thereby supply the power supply voltage to the control signal supply circuit.

(8) Further, according to the invention, preferably, the semiconductor circuit component as in (7) further includes: a first externally leading-out terminal connected to the other end of the drive-control semiconductor switching device and to one end of the load-control semiconductor switching device while connected to the power supply; a second externally leading-out terminal connected to a ground end of the voltage supply circuit while connected to the ground through the switch unit; a third externally leading-out terminal connected to the other end of the load-control semiconductor switching device while connected to the load; and a fourth externally leading-out terminal connected to a ground end of the control signal supply circuit while connected to the ground.

In this configuration, for example, the first and second externally leading-out terminals can be made to correspond to terminals at opposite ends of a relay coil, and the first and third externally leading-out terminals can be made to correspond to terminals at opposite ends of relay contacts, and the fourth externally leading-out terminal is grounded. Hence, the semiconductor circuit component can take the place of the prior-art mechanical relay without any substantial change of the circuit configuration of the bus bar circuit board.

(9) Further, according to the invention, in the semiconductor circuit component according to as in (1), the drive control circuit has first and second drive control circuits and the switch unit has first and second switch units, the first drive control circuit being connected in series with the first switch unit between the power supply and the ground, the second drive control circuit being connected in series with the second switch unit between the power supply and the ground, so that only when the first and second switch units are turned on, the power supply voltage is supplied from the drive control circuit to the control signal supply circuit.

In this configuration, only when the first and second switch units are turned on simultaneously, the power supply voltage is supplied to the control signal supply circuit. Accordingly, the load can be prevented more surely from malfunctioning due to the switch unit, so that the semiconductor circuit component can take the place of the mechanical relay.

(10) Further, according to the invention, in the semiconductor circuit component as in (9), preferably, the first drive control circuit includes a first drive-control semiconductor switching device with a control terminal, and a first voltage supply circuit for supplying a drive voltage to the control terminal of the first drive-control semiconductor switching device when the first switch unit is turned on and the first voltage supply circuit is supplied with a power supply voltage having a rated value; the second drive control circuit includes a second drive-control semiconductor switching device with a control terminal, and a second voltage supply circuit for supplying a drive voltage to the control terminal of the second drive-control semiconductor switching device when the second switch unit is turned on and the second voltage supply circuit is supplied with a power supply voltage having a rated value; and when the first and second drive-control semiconductor switching devices are supplied with drive voltages from the first and second voltage supply circuits respectively and driven, the power supply voltage is supplied from the first and second drive-control semiconductor switching devices to the control signal supply circuit.

In this configuration, even if leakage resistance generated between contacts of one of the switch units is low, the power supply voltage having a rated value is not supplied to the voltage supply circuit connected to the other switch unit as long as leakage resistance generated between contacts of the other switch unit is high. Hence, the load can be prevented more surely from malfunctioning due to the externally provided switch units, so that the semiconductor circuit component can take the place of the mechanical relay.

(11) Further, according to the invention, in the semiconductor circuit component as in (10), preferably, the first voltage supply circuit includes a first voltage dividing circuit for dividing the power supply voltage supplied through the first switch unit, and a first voltage suppressing circuit for suppressing a partial voltage into a predetermined value, the partial voltage being obtained by the first voltage dividing circuit; and the second voltage supply circuit includes a second voltage dividing circuit for dividing the power supply voltage supplied through the second switch unit, and a second voltage suppressing circuit for suppressing a partial voltage into a predetermined value, the partial voltage being obtained by the second voltage dividing circuit.

In this configuration, even if the leakage resistance generated between contacts of one of the switch units is low, only the power supply voltage with a low value is allowed to be supplied to the voltage supply circuit connected to the other switch unit as long as the leakage resistance generated between contacts of the other switch unit is high. Moreover, the power supply voltage having the low value is further divided. Hence, the drive-control semiconductor switching device is not made electrically conductive, so that the control signal supply circuit is not driven. As a result, the load can be prevented more surely from malfunctioning due to the externally provided switch units, so that the semiconductor circuit component can take the place of the mechanical relay.

(12) According to the invention, in the semiconductor circuit component as in (10) or (11), preferably, the first drive-control semiconductor switching device is formed to have one end connected to a ground end of the control signal supply circuit while the ground end is grounded through the other end of the first drive-control semiconductor switching device, and the second drive-control semiconductor switching device is formed to have one end connected to a power input end of the control signal supply circuit while the power input end is connected to the power supply through the other end of the second drive-control semiconductor switching device, so that when a drive voltage is supplied from the first voltage supply circuit to the first drive-control semiconductor switching device to thereby drive the first drive-control semiconductor switching device and when a drive voltage is supplied from the second voltage supply circuit to the second drive-control semiconductor switching device to thereby drive the second drive-control semiconductor switching device, the power supply voltage is supplied from the first and second drive-control semiconductor switching device to the control signal supply circuit.

In this configuration, when a drive voltage is supplied from the first voltage supply circuit to thereby drive the first drive-control semiconductor switching device, the ground end of the control signal supply circuit is grounded, whereas when a drive voltage is supplied from the second voltage supply circuit to thereby drive the second drive-control semiconductor switching device, the power input end of the control signal supply circuit is connected to the power supply. Thus, the power supply voltage can be supplied to the control signal supply circuit.

(13) According to the invention, the semiconductor circuit component as in (12) further includes: a first externally leading-out terminal connected to a power input end of the first voltage supply circuit while connected to the power supply through the first switch unit; a second externally leading-out terminal connected to a ground end of the second voltage supply circuit while connected to the ground through the second switch unit; a third externally leading-out terminal connected to the other end of the second drive-control semiconductor switching device and to one end of the load-control semiconductor switching device while connected to the power supply; a fourth externally leading-out terminal connected to the other end of the load-control semiconductor switching device while connected to the load; and a fifth externally leading-out terminal connected to the other end of the first drive-control semiconductor switching device while connected to the ground.

In this configuration, for example, the first and second externally leading-out terminals are made to correspond to terminals at opposite ends of a relay coil, the third and fourth externally leading-out terminals are made to correspond to terminals at opposite ends of relay contacts, and the fifth externally leading-out terminal is grounded. Hence, the semiconductor circuit component can take the place of the prior-art mechanical relay without any substantial change of the circuit configuration of the bus bar circuit board.

DETAILED DESCRIPTION OF THE PREFERRED EMBODIMENTS

Figure 1:
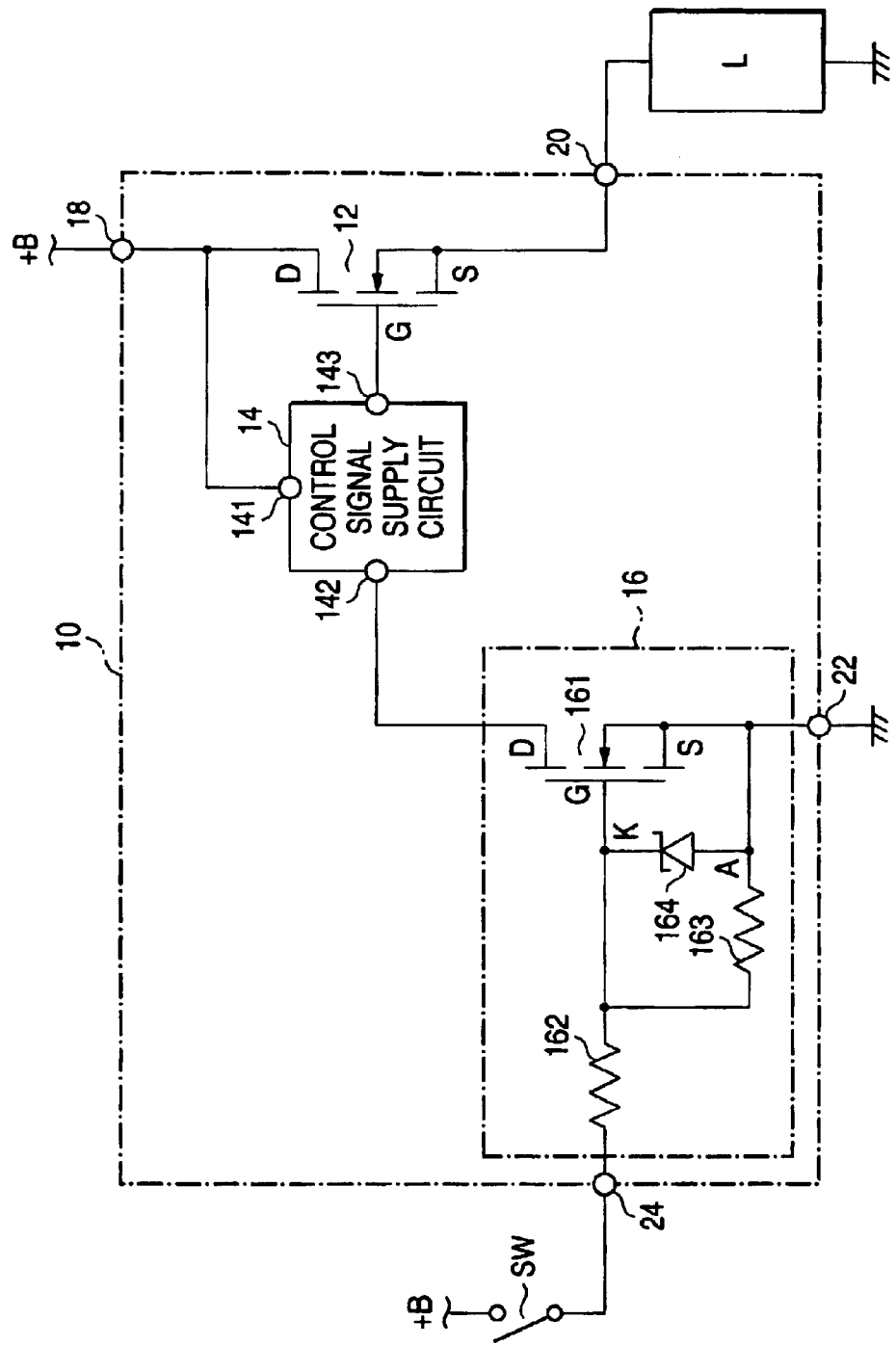
FIG. 1 is a diagram showing a circuit configuration of a semiconductor circuit component according to a first embodiment of the invention.

FIG. 1 is a diagram showing a configuration of a semiconductor circuit component having a switching function according to a first embodiment of the invention. In the drawing, the semiconductor circuit component 10 is applied to ON/OFF control of a power supply voltage supplied to an on-vehicle electrical component, so that the semiconductor circuit component 10 is easy to take the place of a mechanical relay in a prior-art relay circuit shown in FIG. 6. The semiconductor circuit component 10 includes a switching means, N-channel MOS-FET 12, a control signal supply means, circuit 14, and a drive control means, circuit 16. The N-channel MOS-FET 12 is a semiconductor switching device with a control terminal for controlling a load. The control signal supply circuit 14 is made of a charging pump circuit for supplying a control signal to a gate G, as a control terminal, of the MOS-FET 12. The drive control circuit 16 can drive the control signal supply circuit 14 only when supplied with a normal power supply voltage. In this embodiment, all these constituent members are formed integrally on one and the same semiconductor substrate.

The MOS-FET 12 is, for example, of an enhancement type. The MOS-FET 12 has a drain D, a source S and the gate G. The drain D is connected to an externally leading-out terminal 18 connected to a +B terminal of a battery power supply. The source S is connected to an externally leading-out terminal 20 connected to an end of a load L, which is an on-vehicle electrical component, in opposition to a grounded end of the load L. The gate G, as the control terminal, is connected to the control signal supply circuit 14.

The control signal supply circuit 14 is provided so that the power supply voltage supplied from the battery power supply is boosted to a predetermined value. The control signal supply circuit 14 has a power input end 141, a ground end 142, and an output end 143. The power input end 141 is connected to the externally leading-out terminal 18 connected to the +B terminal of the battery power supply. The ground end 142 is connected, through the drive control circuit 16, to an externally leading-out terminal 22 grounded. The output end 143 is connected to the gate G of the MOS-FET 12. In the control signal supply circuit 14, the power input end 141 is connected to the +B terminal of the battery power supply through the externally leading-out terminal 18, and the ground end 142 is grounded through the drive control circuit 16 and the externally leading-out terminal 22, so that a control signal is output from the output terminal 143 to make electrical conduction (an on state) between the drain D and the source S of the MOS-FET 12.

The drive control circuit 16 has a driver control switching means enhancement type N-channel MOS-FET 161, a first resistor element 162, a second resistor element 163, and a voltage suppressing means, Zener diode 164. The N-channel MOS-FET 161, which is a semiconductor switching device with a control terminal for drive control, has a drain D connected to the ground end 142 of the control signal supply circuit 14, a source S connected to the externally leading-out terminal 22, and a gate G. The first resistor element 162 is connected between an externally leading-out terminal 24 and the gate G of the MOS-FET 161, the externally leading-out terminal 24 being connected to an end of an external switch SW. The second resistor element 163 is connected between the gate G and the source S of the MOS-FET 161. The Zener diode 164 has an anode A connected to the source S of the MOS-FET 161, and a cathode K connected to the gate G of the MOS-FET 161. Incidentally, the other end of the switch SW is arranged to be connected to the +B terminal of the battery power supply.

The first resistor element 162 and the second resistor element 163 form a voltage dividing circuit for dividing a power supply voltage supplied from the battery power supply. When the battery power supply is fully charged, a large voltage exceeding a required minimum value is taken out from junctions between the first resistor element 162 and the second resistor element 163 to make normal electrical conduction between the drain D and the source S of the MOS-FET 161 (that is, to set drain-source ohmic resistance to a small value).

Further, the Zener diode 164 forms a voltage suppressing circuit interposed between the drain D and the source S of the MOS-FET 161. The Zener diode 164 suppresses a partial voltage taken out from the junctions between the first resistor element 162 and the second resistor element 163 to be a predetermined value (a voltage value required for making normal electrical conduction between the drain D and the source S) which is determined by the Zener voltage, so that the Zener diode 164 supplies the partial voltage, as a driving voltage, between the gate G and the source S of the MOS-FET 161. Incidentally, the voltage dividing circuit including the first and second resistor elements 162 and 163, and the voltage suppressing circuit including the Zener diode 164 form a voltage supply circuit for supplying a driving voltage between the gate G and the source S of the MOS-FET 161.

Further, even in the case where leakage resistance (for example, 10 KΩ) is generated between contacts of a switch SW due to dew drops so that a power supply voltage is supplied from the battery power supply to an externally leading-out terminal 24 though the switch SW is turned off, the respective resistance values of the first and second resistor elements 162 and 163 are set so that only a voltage which is low enough to make substantially electrical non-conduction (an off state) between the drain D and the source S of the MOS-FET 161 is allowed to be supplied between the gate G and the source S of the MOS-FET 161.

That is, when such leakage resistance is generated between the contacts of the switch SW, a voltage drop occurs in the leakage resistance so that only a power supply voltage with a voltage value lower than a rated value is allowed to be supplied to the power input end of the first resistor element 162 which is the side connected to the externally leading-out terminal 24. For this reason, the respective resistance values of the first and second resistor elements 162 and 163 are set so that only a voltage which is low enough to establish substantially an electrical non-conduction state between the drain D and the source S of the MOS-FET 161 is allowed to be supplied between the gate G and the source S of the MOS-FET 161 as if a power supply voltage with a value lower than the rated value were divided.

In the semiconductor circuit component 10 having the circuit configuration as described above, the externally leading-out terminal 18 is connected to the +B terminal of the battery power supply, the externally leading-out terminal 20 is connected to the load L, the externally leading-out terminal 22 is grounded, and the externally leading-out terminal 24 is connected to the +B terminal of the battery power supply through the switch SW. In this state, when the switch SW is turned on, the power supply voltage having a rated value and supplied from the battery power supply is divided by the first and second resistor elements 162 and 163 and, on the other hand, the partial voltage obtained by the voltage division is suppressed into a value determined by the Zener voltage of the Zener diode 164 and supplied between the gate G and the source S of the MOS-FET 161.

Hence, electrical conduction is made between the drain D and the source S of the MOS-FET 161 so that the ground end 142 of the control signal supply circuit 14 is grounded through the externally leading-out terminal 22. As a result, the power supply voltage is supplied to the control signal supply circuit 14 from the battery power supply. Further, a predetermined control signal is output from the output end 143 so that electrical conduction is made between the drain D and the source S of the MOS-FET 12. As a result, the power supply voltage from the battery power supply is supplied to the load L through the MOS-FET 12.

Further, in the semiconductor circuit component 10 having the circuit configuration as described above, even if leakage resistance is generated between the contacts of the switch SW due to dew drops though the switch SW is not turned on, setting is made so that only a voltage which is low enough to make substantially electrical non-conduction between the drain D and the source S of the MOS-FET 161 is allowed to be supplied between the gate G and the source S of the MOS-FET 161. Accordingly, the load L can be prevented surely from malfunctioning through the control signal supply circuit 14 which operates to make electrical conduction between the drain D and the source S of the load-control MOS-FET 12 even though the switch SW is not turned on.

Figure 2:
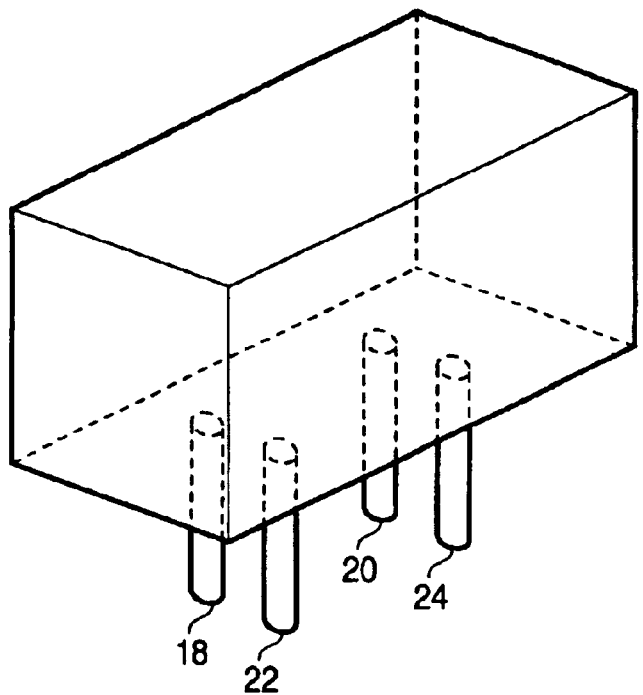
FIG. 2 is a perspective view of an external appearance showing the arrangement of externally leading-out terminals of the semiconductor circuit component formed as a DIP type.
Figure 3:
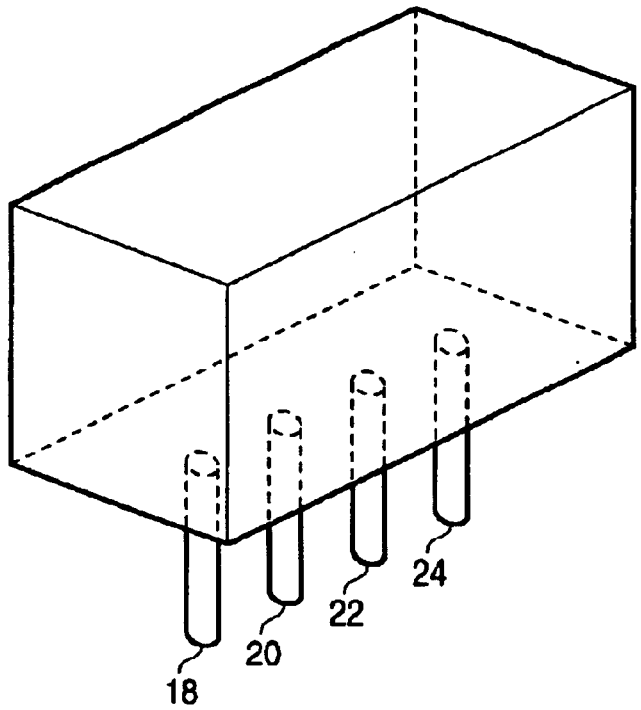
FIG. 3 is a perspective view of an external appearance showing the arrangement of externally leading-out terminals of the semiconductor circuit component formed as an SIP type.

Further, in the semiconductor circuit component 10 having the circuit configuration as described above, for example, the externally leading-out terminals 18, 20, 22 and 24 are formed into a DIP type or an SIP type. In the DIP type, the terminals are arranged in two rows and taken out in one direction as shown in FIG. 2. In the SIP type, the terminals are arranged in one row and taken out in one direction as shown in FIG. 3. The externally leading-out terminals 18, 20, 22 and 24 are mounted on bus bar terminals of a bus bar circuit board so that the semiconductor circuit component 10 can be used to take the place of the mechanical relay of the prior-art relay circuit shown in FIG. 6 without any change of the bus bar circuit board or with a slight change thereof as to the shape and position of each bus bar terminal and the number of bus bar terminals (that is, without any substantial change of the bus bar circuit board). In addition, the semiconductor circuit component 10 has characteristic equivalent to that of the prior-art mechanical relay and can take the place of the prior-art mechanical relay without any inconvenience.

Figure 6:
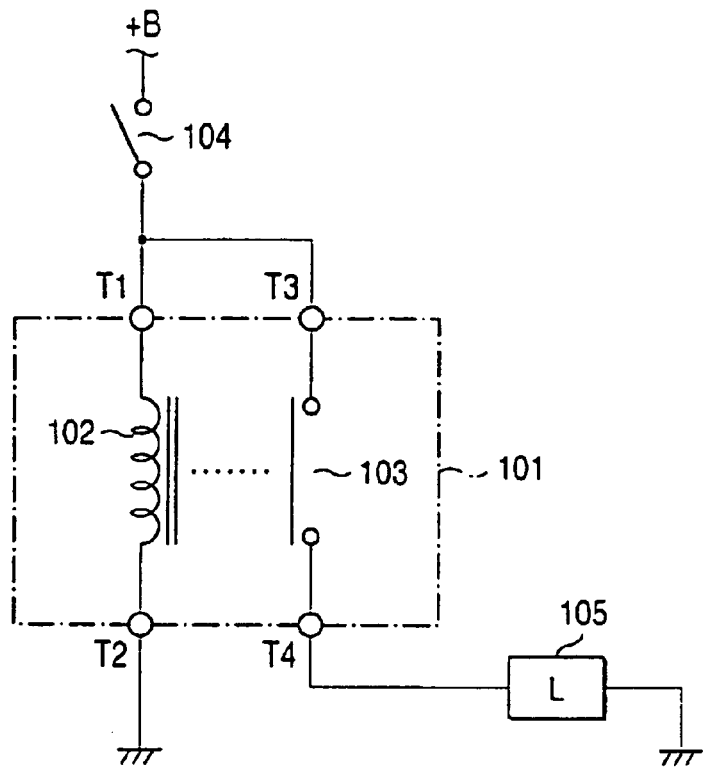
FIG. 6 is a diagram showing a configuration of a prior-art relay circuit.

That is, in the relay circuit shown in FIG. 6, the externally leading-out terminal 24 of the semiconductor circuit component 10 may be inserted into a bus bar terminal into which the terminal T1 of the mechanical relay 101 is to be inserted, the externally leading-out terminal 22 of the semiconductor circuit component 10 may be inserted into a bus bar terminal into which the terminal T2 of the mechanical relay 101 is to be inserted, the externally leading-out terminal 18 of the semiconductor circuit component 10 may be inserted into a bus bar terminal into which the terminal T3 of the mechanical relay 101 is to be inserted, and the externally leading-out terminal 20 of the semiconductor circuit component 10 may be inserted into a bus bar terminal into which the terminal T4 of the mechanical relay 101 is to be inserted.

Figure 4:
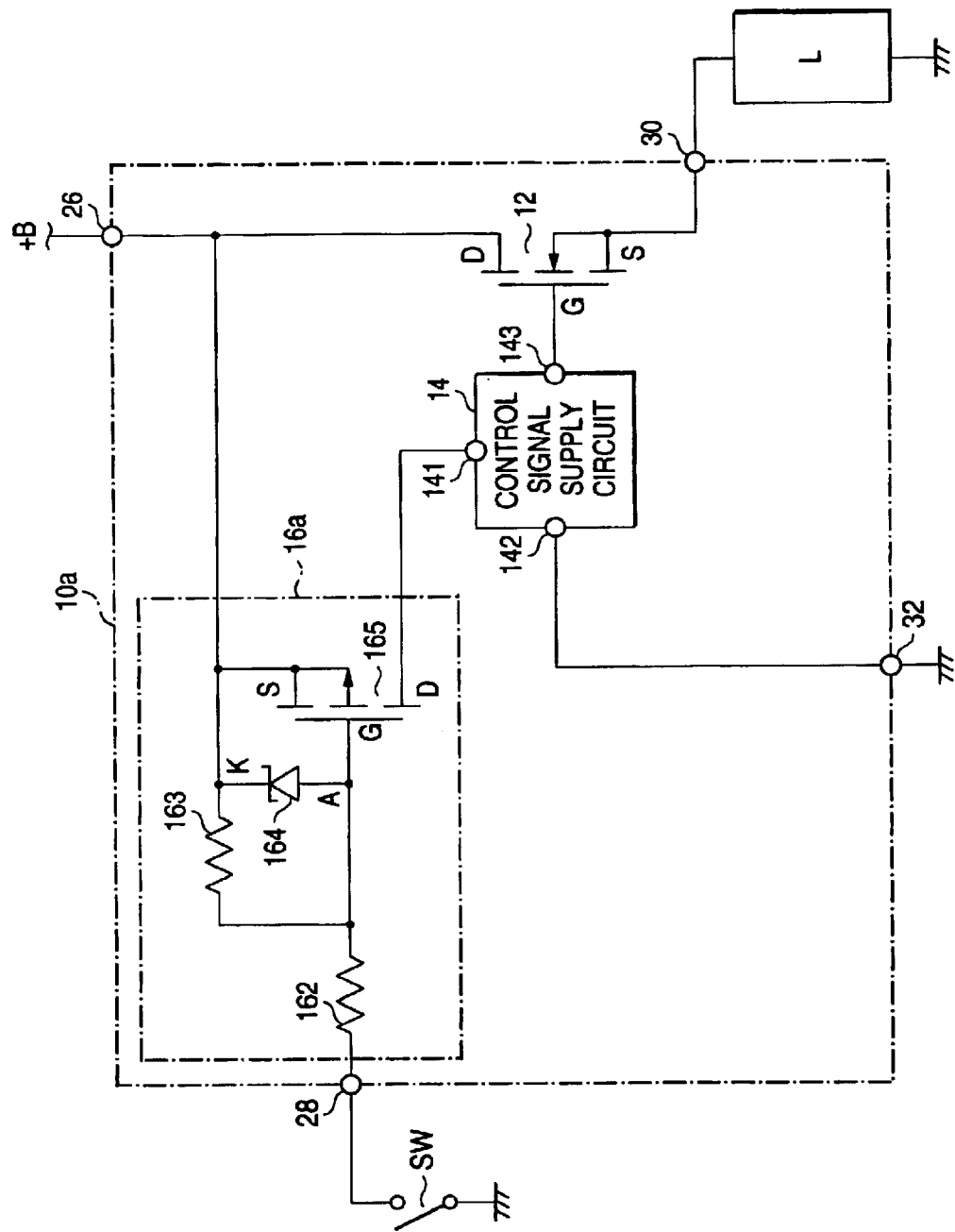
FIG. 4 is a diagram showing a circuit configuration of the semiconductor circuit component according to a second embodiment of the invention.

FIG. 4 is a diagram showing a configuration of the semiconductor circuit component having a switching function according to a second embodiment of the invention. The semiconductor circuit component 10a in the second embodiment is easy to take the place of a mechanical relay in a prior-art relay circuit shown in FIG. 7. The semiconductor circuit component 10a in the second embodiment has the same basic configuration as that of the semiconductor circuit component 10 in the first embodiment except that a drive control circuit 16a having the same function as that of the drive control circuit 16 in the semiconductor circuit component 10 in the first embodiment is connected to the power input end 141 side of the control signal supply circuit 14 in the second embodiment. Hence, identical constituent members are referenced correspondingly and the detailed description of the identical constituent members will be omitted hereunder. The point of difference from the semiconductor circuit component 10 in the first embodiment will be mainly described hereunder.

That is, since the semiconductor circuit component 10a has the drive control circuit 16a connected to the power input end 141 side of the control signal supply circuit 14, a P-channel MOS-FET 165 is used to take the place of the N-channel MOS-FET 161 in the drive control circuit 16, and a Zener diode 164 has an anode A connected to a gate G of the MOS-FET 165, and a cathode K connected to a source S of the MOS-FET 165.

Further, the source S of the MOS-FET 165 is connected, together with a drain D of a load-control MOS-FET 12, to an externally leading-out terminal 26 connected to a +B terminal of a battery power supply while the drain D of the MOS-FET 165 is connected to the power input end 141 of the control signal supply circuit 14. One end of a first resistor element 162, as the ground side, in a voltage dividing circuit forming the drive control circuit 16a is connected to an externally leading-out terminal 28 connected to one end of a switch SW. Incidentally, the other end of the switch SW is arranged to be grounded. In addition, a source S of the load-control MOS-FET 12 is connected to an externally leading-out terminal 30 connected to an end of a load L in opposition to a grounded end of the load L. A ground end 142 of the control signal supply circuit 14 is grounded through an externally leading-out terminal 32.

In the semiconductor circuit component 10a having the circuit configuration as described above, the externally leading-out terminal 26 is connected to the +B terminal of the battery power supply, the externally leading-out terminal 28 is grounded through the switch SW, the externally leading-out terminal 30 is connected to the load L, and the externally leading-out terminal 32 is grounded. In this state, when the switch SW is turned on, the power supply voltage having a rated value is supplied from the battery power supply to the voltage dividing circuit including the first and second resistor elements 162 and 163. The power supply voltage is divided by the voltage dividing circuit, so that a partial voltage obtained by the voltage division is suppressed into a value determined by the Zener voltage of the Zener diode 164 which forms a voltage suppressing circuit. The partial voltage is supplied as a driving voltage between the gate G and the source S of the MOS-FET 165. Incidentally, the voltage dividing circuit including the first and second resistor elements 162 and 163, and the voltage suppressing circuit including the Zener diode 164 form a voltage supply circuit for supplying a driving voltage between the gate G and the source S of the MOS-FET 165.

Accordingly, electrical conduction is made between the drain D and the source S of the MOS-FET 165, so that the power input end 141 of the control signal supply circuit 14 is connected to the +B terminal of the battery power supply through the MOS-FET 165 and the externally leading-out terminal 26. As a result, the power supply voltage from the battery power supply is supplied to the control signal supply circuit 14. Further, a predetermined control signal is output from the output end 143, so that electrical conduction is made between the drain D and the source S of the MOS-FET 12. As a result, the power supply voltage from the battery power supply is supplied to the load L through the MOS-FET 12.

Further, in the semiconductor circuit component 10a having the circuit configuration as described above, even if leakage resistance is generated between contacts of the switch SW due to dew drops though the switch SW is not turned on, the respective resistance values of the first and second resistor elements 162 and 163 are set so that only a voltage which is low enough to make substantially electrical non-conduction between the drain D and the source S of the MOS-FET 165 is allowed to be supplied between the gate G and the source S of the MOS-FET 165 in the same manner as in the first embodiment. Accordingly, the load L can be prevented surely from malfunctioning through the control signal supply circuit 14 which operates to make electrical conduction between the drain D and the source S of the load-control MOS-FET 12 though the switch SW is not turned on.

Further, in the semiconductor circuit component 10a having the circuit configuration as described above, the externally leading-out terminals 26, 28, 30 and 32 are formed into the DIP type as shown in FIG. 2 or the SIP type as shown in FIG. 3, in the same manner as described in the semiconductor circuit component 10 in the first embodiment. When the externally leading-out terminals 26, 28, 30 and 32 are mounted on bus bar terminals of a bus bar circuit board, the semiconductor circuit component 10a can be used to take the place of the mechanical relay of the prior-art relay circuit shown in FIG. 7 by without any substantial change of the bus bar circuit board. In addition, the semiconductor circuit component 10a has characteristic equivalent to that of the prior-art mechanical relay and can take the place of the mechanical relay without any inconvenience.

Figure 7:
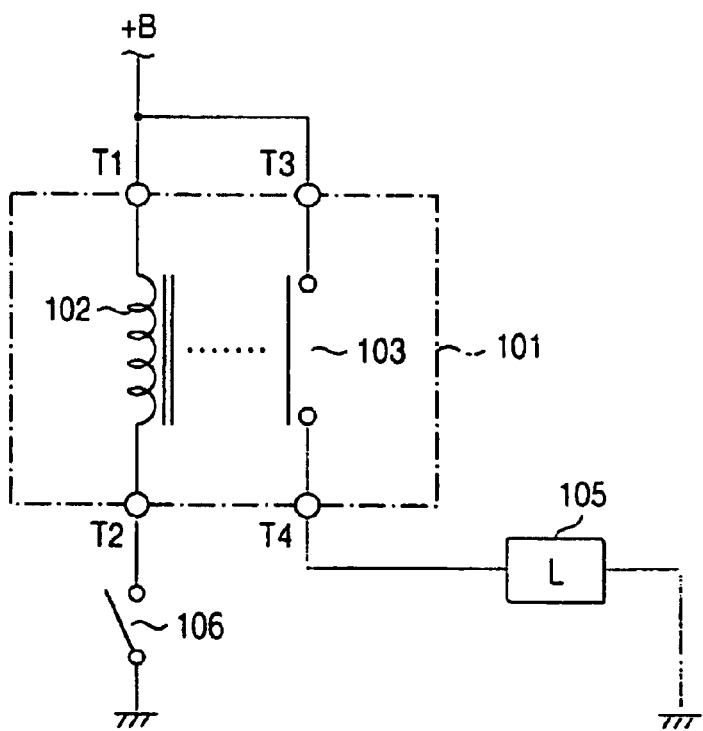
FIG. 7 is a diagram showing another configuration of the prior-art relay circuit.

That is, the externally leading-out terminal 26 of the semiconductor circuit component 10a may be inserted into a bus bar terminal into which the terminal T1 of the mechanical relay 101 shown in FIG. 7 is to be inserted, the externally leading-out terminal 28 of the semiconductor circuit component 10a may be inserted into a bus bar terminal into which the terminal T2 of the mechanical relay 101 is to be inserted, and the externally leading-out terminal 30 of the semiconductor circuit component 10a may be inserted into a bus bar terminal into which the terminal T4 of the mechanical relay 101 is to be inserted. Further, in the place of the terminal T3 of the mechanical relay 101, a new bus bar terminal may be provided to be grounded so that the externally leading-out terminal 32 of the semiconductor circuit component 10a is inserted into the newly provided bus bar terminal.

Figure 5:
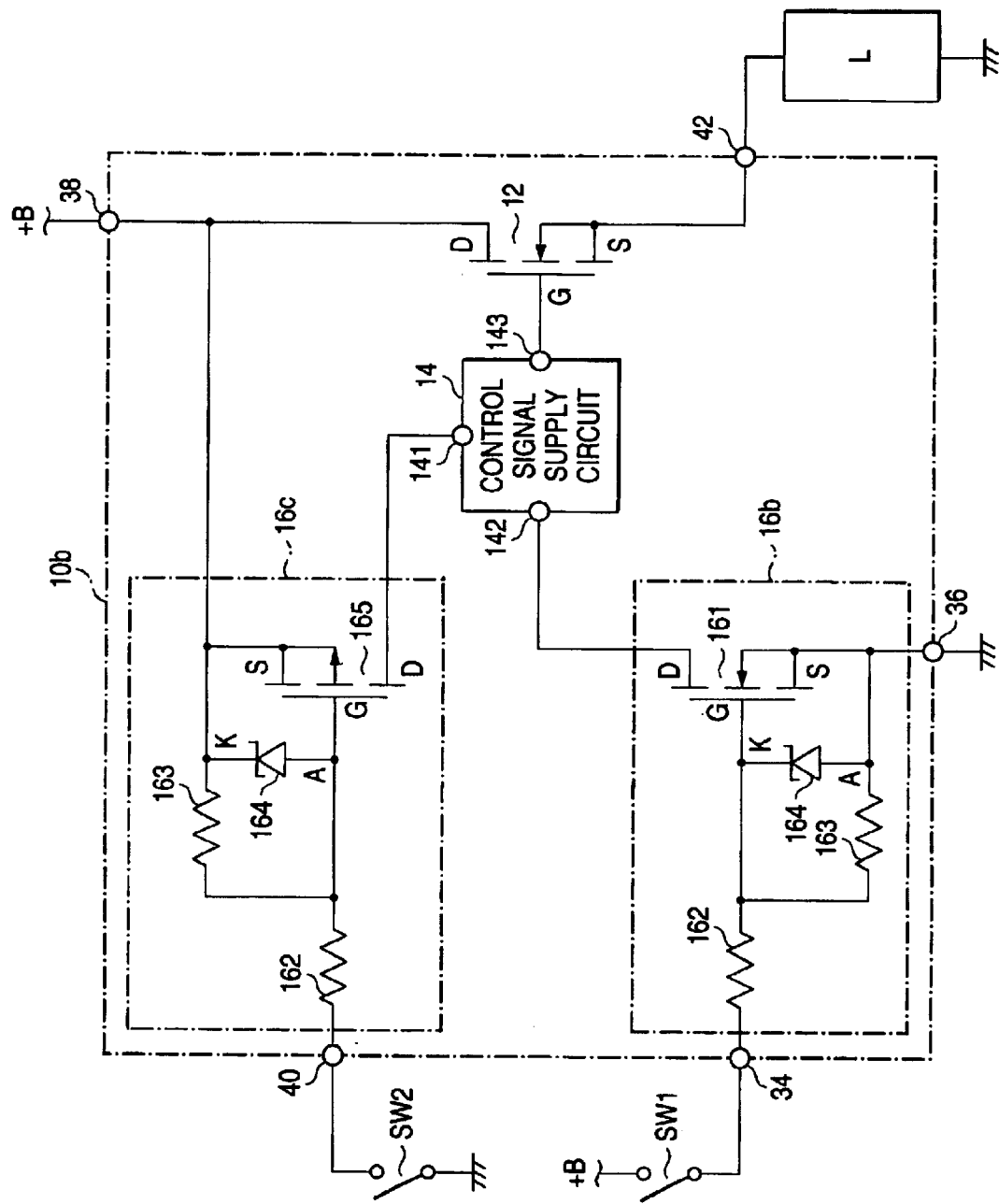
FIG. 5 is a diagram showing a circuit configuration of the semiconductor circuit component according to a third embodiment of the invention.

FIG. 5 is a diagram showing a configuration of the semiconductor circuit component having a switching function according to a third embodiment of the invention. The semiconductor circuit component 10b in the third embodiment is easy to take the place of a mechanical relay in a prior-art relay circuit shown in FIG. 8. The semiconductor circuit component 10b in the third embodiment is formed so that the drive control circuit 16 in the semiconductor circuit component 10 in the first embodiment is additionally provided on the power input end 141 side of the control signal supply circuit 14. Accordingly, the semiconductor circuit component 10b in the third embodiment has the same basic configuration as those of the semiconductor circuit components 10 and 10a in the first and second embodiments. Hence, identical constituent members are referenced correspondingly and the detailed description of the identical constituent members will be omitted hereunder. The point of difference from the first and second embodiments will be mainly described hereunder.

That is, the semiconductor circuit component 10b has a first drive control circuit 16b, and a second drive control circuit 16c. The first drive control circuit 16b has the same function as that of the drive control circuit 16 in the first embodiment. The first drive control circuit 16b is connected to a ground end 142 side of a control signal supply circuit 14 in the same manner as in the drive control circuit 16 in the first embodiment. The second drive control circuit 16c is connected to a power input end 141 side of the control signal supply circuit 14 in the same manner as in the drive control circuit 16a in the second embodiment.

The first drive control circuit 16b includes the same constituent members as those of the drive control circuit 16 in the first embodiment. One end (power input end), as a power supply voltage input side, of a first resistor element 162 is connected to an externally leading-out terminal 34 connected to one end of a first switch SW1 externally provided. A drain D of an MOS-FET 161 is connected to the ground end 141 of the control signal supply circuit 14. A source S of the MOS-FET 161 is grounded through an externally leading-out terminal 36.

The second drive control circuit 16c includes the same constituent members as those of the drive control circuit 16a in the second embodiment. A source S of an MOS-FET 165 is connected, together with a drain D of a load-control MOS-FET 12, to an externally leading-out terminal 38 connected to a +B terminal of a battery power supply. A drain D of the MOS-FET 165 is connected to the power input end 141 of the control signal supply circuit 14. One end (ground end), as a ground side, of the first resistor element 162 is connected to an externally leading-out terminal 40 connected to an end of a second switch SW2 externally provided.

Further, a source S of the load-control MOS-FET 12 is connected to an externally leading-out terminal 42 connected to a load L. Incidentally, the other end of the first switch SW1 is arranged to be connected to the B+terminal of the battery power supply, and the other end of the second switch SW2 is arranged to be grounded. It is preferable for the operation of the first and second switches SW1 and SW2 that the first and second switches SW1 and SW2 are interlocked.

In the semiconductor circuit component 10b having the circuit configuration as described above, the externally leading-out terminal 38 is connected to the +B terminal of the battery power supply, the externally leading-out terminal 42 is connected to the load L, the externally leading-out terminal 36 is grounded, the externally leading-out terminal 34 is connected to the +B terminal of the battery power supply through the first switch SW1, and the externally leading-out terminal 40 is grounded through the second switch SW2. In this state, when the first and second switches SW1 and SW2 are turned on, the power supply voltage having a rated value supplied from the battery power supply is divided by the first and second resistor elements 162 and 163 in the first and second drive control circuits 16b and 16c. Each of partial voltages obtained by the voltage division is suppressed into a value determined by the Zener voltage of a corresponding Zener diode 164 which forms a voltage suppressing circuit. The partial voltages are supplied as driving voltages between the gate G and the source S of the MOS-FET 161 and between the gate G and the source S of the MOS-FET 165, respectively.

Incidentally, in the first drive control circuit 16b, the voltage dividing circuit including the first and second resistor elements 162 an 163, and the voltage suppressing circuit including the Zener diode 164 form a first voltage supply circuit for supplying a driving voltage between the gate G and the source S of the MOS-FET 161. In the second drive control circuit 16c, the voltage dividing circuit including the first and second resistor elements 162 an 163, and the voltage suppressing circuit including the Zener diode 164 form a second voltage supply circuit for supplying a driving voltage between the gate G and the source S of the MOS-FET 165.

Accordingly, electrical conduction is made between the drain D and the source S in each of the MOS-FETs 161 and 165, so that the ground end 142 of the control signal supply circuit 14 is grounded through the MOS-FET 161 and the externally leading-out terminal 36, and so that the power input end 141 of the control signal supply circuit 14 is connected to the +B terminal of the battery power supply through the MOS-FET 165 and the externally leading-out terminal 38. As a result, the power supply voltage from the battery power supply is supplied to the control signal supply circuit 14. Further, a predetermined control signal is output from the output end 143, so that electrical conduction is made between the drain D and the source S of the MOS-FET 12. As a result, the power supply voltage from the battery power supply is supplied to the load L through the MOS-FET 12.

Further, in the semiconductor circuit component 10b having the circuit configuration as described above, even if leakage resistance is generated between contacts in each of the first and second switches SW1 and SW2 due to dew drops though the first and second switches SW1 and SW2 are not turned on, the respective resistance values of the first and second resistor elements 162 and 163 are set so that only a voltage which is low enough to make substantially electrical non-conduction between the drain D and the source S in each of the MOS-FETs 161 and 165 is allowed to be supplied between the gate G and the source S in each of the MOS-FETs 161 and 165 in the same manner as in the first and second embodiments. Accordingly, the load L can be prevented surely from malfunctioning through the control signal supply circuit 14 which operates to make electrical conduction between the drain D and the source S of the load-control MOS-FET 12 though the switches SW1 and SW2 are not turned on.

Further, in the semiconductor circuit component 10b having the circuit configuration as described above, the externally leading-out terminals 34, 36, 38, 40 and 42 may be formed into the DIP type as shown in FIG. 2 or the SIP type as shown in FIG. 3, in the same manner as those of the semiconductor circuit components 10 and 10a in the first and second embodiments. When the externally leading-out terminals 34, 36, 38, 40 and 42 are mounted on bus bar terminals of a bus bar circuit board, the semiconductor circuit component 10b can be used to take the place of the mechanical relay of the prior-art relay circuit shown in FIG. 8 without any substantial change of the bus bar circuit board. In addition, the semiconductor circuit component 10b has characteristic equivalent to that of the prior-art mechanical relay and can take the place of the mechanical relay without any inconvenience.

Figure 8:
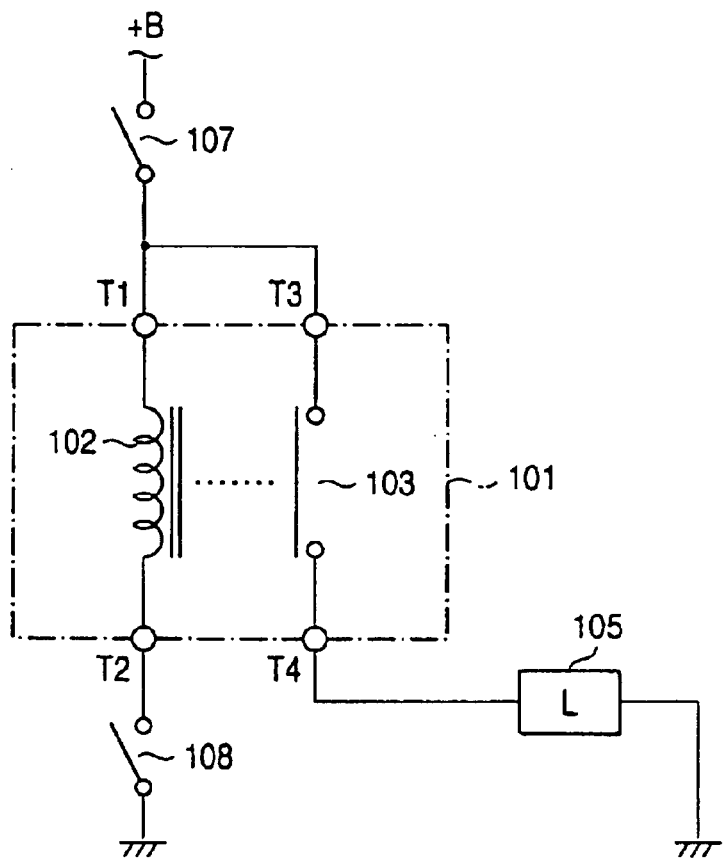
FIG. 8 is a diagram showing a further configuration of the prior-art relay circuit.
Figure 9:
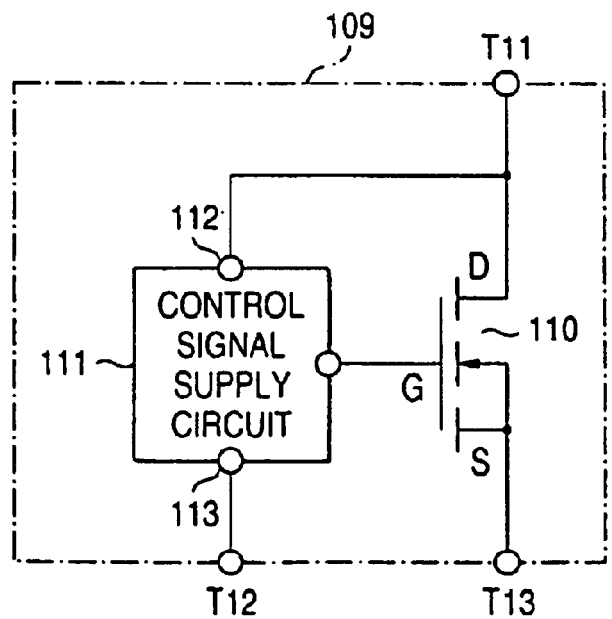
FIG. 9 is a diagram showing the schematic configuration of the prior-art semiconductor circuit component.

That is, the externally leading-out terminal 34 of the semiconductor circuit component 10b may be inserted into a bus bar terminal into which the terminal T1 of the mechanical relay 101 shown in FIG. 8 is to be inserted, the externally leading-out terminal 40 of the semiconductor circuit component 10b may be inserted into a bus bar terminal into which the terminal T2 of the mechanical relay 101 is to be inserted, the externally leading-out terminal 38 of the semiconductor circuit component 10b may be inserted into a bus bar terminal into which the terminal T3 of the mechanical relay 101 is to be inserted, and the externally leading-out terminal 42 of the semiconductor circuit component 10b may be inserted into a bus bar terminal into which the terminal T4 of the mechanical relay 101 is to be inserted. Further, a new bus bar terminal grounded may be provided so that the externally leading-out terminal 36 of the semiconductor circuit component 10b is inserted into the newly provided bus bar terminal.

As described in the embodiments, the invention provides: the MOS-FET 12 which is a load-control semiconductor switching device with a control terminal; the control signal supply circuit 14 for supplying a control signal to the gate G, as the control terminal, of the MOS-FET 12 to drive the MOS-FET 12; and the drive control circuits 16, 16a, 16b and 16c for performing drive control so that, only when the switches SW, SW1 and SW2 provided externally are turned on, a power supply voltage is supplied from the drive control circuits 16, 16a, 16b and 16c to the control signal supply circuit 14 to thereby make the control signal supply circuit 14 output a control signal.

Therefore, in the manner similar to the prior-art mechanical relay, the operation of the load is switched in response to the ON/OFF operation of the switching unit (units) externally provided, and the load can be prevented surely from malfunctioning even if leakage resistance is generated between contacts in each of the externally provided switches SW, SW1 and SW2 due to dew drops. Further, when, for example, externally leading-out terminals to he disposed are arranged in the same layout configuration as that in the prior-art mechanical relay, the semiconductor circuit component according to the invention can take the place of the prior-art mechanical relay without any substantial change of the circuit configuration of the bus bar circuit board.

Incidentally, the invention is not limited to the embodiments but may adopt various modifications which will be described below.

(1) In the respective embodiments, each of the semiconductor circuit components 10, 10a and 10b is formed by a semiconductor integrated circuit technique in which respective constituent members are formed on one and the same semiconductor substrate. The invention is, however, not limited thereto. For example, the semiconductor circuit component may be formed by a hybrid integrated circuit technique in which discrete parts are mounted on an electrically insulating substrate such as an alumina substrate having a wiring pattern formed thereon to thereby form a predetermined electric circuit.

(2) Although the structure of each of the switches SW, SW1 and SW2 externally provided to the semiconductor circuit components 10, 10a and 10b is not particularly described in the respective embodiments, it is, for example, possible to use a mechanical switch having two contacts mechanically connected/disconnected to/from each other by a contact plate or a semiconductor switch having two contacts (two electrodes) electrically connected/disconnected to/from each other. When either type switch is used, each of the semiconductor circuit components 10, 10a and 10b according to the invention is provided so that the load can be surely prevented from malfunctioning.

(3) In each of the embodiments, the load-control semiconductor switching device includes the MOS-FET 12, and the drive-control semiconductor switching device contains each of the MOS-FET 161 and 165. The invention is, however, not limited thereto. It is possible to use other semiconductor switching devices such as a bipolar transistor, and an IGBT which is an integrated device of an MOS-FET and a bipolar transistor.

(4) In each of the embodiments, the voltage dividing circuit in each of the drive control circuits 16, 16a, 16b an 16c has a voltage dividing circuit including the first and second resistor elements 162 and 163. The invention is, however, not limited thereto. For example, the voltage dividing circuit may contain a semiconductor device.

(5) In each of the embodiments, the voltage suppressing circuit in each of the drive control circuits 16, 16a, 16b and 16c is made of a Zener diode 164. The invention is, however, not limited thereto. For example, the voltage suppressing circuit may include another semiconductor device having substantially the same function as that of the Zener diode, or may include a plurality of circuit elements such as transistors so as to substantially have the same function as that of the Zener diode.

(6) Although each of the embodiments has been described on the case where the control signal supply circuit 14 is simply to supply a control signal to the gate G of the MOS-FET 12, various functions such as an overvoltage protecting circuit for protection from an excessive power supply voltage, or a current limiting circuit for suppressing an overcurrent when the overcurrent flows because of short-circuiting, may be added to the control signal supply circuit 14 so that each of the semiconductor circuit components 10, 10a and 10b may be formed as a so-called intelligent power device (IPD).

(7) Although each of the embodiments has been described on the case where the control signal supply circuit 14 is simply to supply a control signal to the gate G of the MOS-FET 12, a PWM control system may be used so that electric power supplied to the load is controlled on the basis of the control signal formed as a pulse signal by changing the duty of the pulse signal.

(8) Although each of the embodiments has been described on the case where each of the semiconductor circuit components 10, 10a, and 10b is mounted on the bus bar terminals of the bus bar circuit substrate, the invention is not limited thereto. For example, the semiconductor circuit component may be mounted on a printed circuit board. In this case, each of the semiconductor circuit components 10, 10a, and 10b may be formed as an SMD structure (surface mounting structure) having externally leading-out terminals 18, 20, . . . , 40, 42 each made of a metal plate or a metal film, as well as the DIP or SIP structure as described above.

(9) In the embodiments, the externally leading-out terminal 18 in the semiconductor circuit component 10 (in FIG. 1) is connected to the power input end 141 of the control signal supply circuit 14 and to the drain D of the MOS-FET 12. The externally leading-out terminal 18 may be, however, divided into two externally leading-out terminals so that one of the terminals is connected to the power input end 141 of the control signal supply circuit 14 while the other is connected to the drain D of the MOS-FET 12.

Further, the externally leading-out terminal 26 in the semiconductor circuit component 10a (in FIG. 4) is connected to the source S of the MOS-FET 165 and to the drain D of the MOS-FET 12. The externally leading-out terminal 26 may be, however, divided into two externally leading-out terminals so that one of the terminals is connected to the source S of the MOS-FET 165 while the other is connected to the drain D of the MOS-FET 12.

Further, the externally leading-out terminal 38 in the semiconductor circuit component 10a (in FIG. 5) is connected to the source S of the MOS-FET 165 and to the drain D of the MOS-FET 12. The externally leading-out terminal 38 may be, however, divided into two externally leading-out terminals so that one of the terminals is connected to the source S of the MOS-FET 165 while the other is connected to the drain D of the MOS-FET 12. In any case, the two externally leading-out terminals obtained by the division may be preferably arranged to be connected to the +B terminal of the battery power supply.

(10) Although each of the embodiments has been described on the case where each of the semiconductor circuit components 10, 10a and 10b is applied to an operation of turning on/off the power supply voltage supplied to the on-vehicle electrical component, the invention is, however, not limited thereto. For example, it is a matter of course that the semiconductor circuit component may be used for an operation of turning on/off the power supply voltage supplied to any other electric component than the on-vehicle electrical component. In addition, the semiconductor circuit component may be used as a switching unit in various kinds of electric circuits.

As described above, according to the invention, there is provided a semiconductor circuit component which has: a load-control semiconductor switching device with a control terminal; a control signal supply circuit for supplying a control signal to the control terminal of the load-control semiconductor switching device to drive the load-control semiconductor switching device; and a drive control circuit for performing drive control so that only when a switching unit (switching units) externally provided is (are) turned on, a power supply voltage is supplied from the drive control circuit to the control signal supply circuit to thereby make the control signal supply circuit output a control signal. Accordingly, the operation of the load is switched in response to the ON/OFF operation of the externally provided switching unit (units) in the same manner as in the prior-art mechanical relay so that the load can be prevented from malfunctioning due to leakage resistance in the switching unit (units).

What is claimed is:

1. A semiconductor circuit component capable of being driven when an externally provided switch unit is turned on to supply a first power supply voltage to said semiconductor circuit component, said semiconductor circuit component comprising:
 a load-control semiconductor switching device with a control terminal;
 a control signal supply circuit for supplying a control signal to said control terminal of said load-control semiconductor switching device to drive said load-control semiconductor switching device, and wherein the control signal supply circuit is coupled to a third power supply voltage; and
 a drive control circuit for controlling the control signal supply circuit in a manner so that, only when said switch unit is turned on, a second power supply voltage is supplied from said drive control circuit to said control signal supply circuit to make said control signal supply circuit output the control signal, wherein said second power supply voltage is less than said third power supply voltage and said drive control circuit further comprises a drive control semiconductor switching device with a control terminal and a voltage suppressing circuit disposed between the control terminal of the drive control semiconductor switching device and the second power supply voltage.

2. The semiconductor circuit component according to claim 1, wherein said drive control circuit is disposed between the first and the second power supply voltages and in series with said switch unit, so that only when said switch unit is turned on, the second power supply voltage is supplied from said drive control circuit to said control signal supply circuit.

3. A semiconductor circuit component capable of being driven when an externally provided switch unit is turned on to supply a first power supply voltage to said semiconductor circuit component, said semiconductor circuit component comprising:
 a load-control semiconductor switching device with a control terminal;
 a control signal supply circuit for supplying a control signal to said control terminal of said load-control semiconductor switching device to drive said load-control semiconductor switching device; and
 a drive control circuit for controlling the control signal supply circuit in a manner so that, only when said switch unit is turned on, a second power supply voltage is supplied from said drive control circuit to said control signal supply circuit to make said control signal supply circuit output the control signal, wherein
 said drive control circuit further comprises:
  a drive-control semiconductor switching device with a control terminal; and
  a voltage supply circuit for supplying a drive voltage to said control terminal of said drive-control semiconductor switching device when said switch unit is turned on and the first power supply voltage is supplied to said voltage supply circuit, and wherein
  said drive-control semiconductor switching device performs drive control so that the second power supply voltage is supplied from said drive-control semiconductor switching device to said control signal supply circuit when the drive voltage is supplied to said drive-control semiconductor switching device from said voltage supply circuit to drive said drive-control semiconductor switching device.

4. The semiconductor circuit component according to claim 3, wherein said voltage supply circuit comprises:
 a voltage dividing circuit for dividing the first power supply voltage supplied through said switch unit, and
 a voltage suppressing circuit for suppressing a partial voltage into a predetermined value, the partial voltage being obtained by said voltage dividing circuit.

5. The semiconductor circuit component according to claim 3, wherein said drive-control semiconductor switching device has one end connected to a ground end of said control signal supply circuit while the ground end is grounded through the other end of said drive-control semiconductor switching device, so that when a drive voltage is supplied to said drive-control semiconductor switching device from said voltage supply circuit to drive said drive-control semiconductor switching device, the second power supply voltage is supplied from said drive-control semiconductor switching device to said control signal supply circuit.

6. The semiconductor circuit component according to claim 5, further comprising:
 a first externally leading-out terminal connected to a power input end of said voltage supply circuit while connected to the first power supply voltage through said switch unit;

a second externally leading-out terminal connected to the other end of said drive-control semiconductor switching device while connected to the ground;

a third externally leading-out terminal connected to one end of said load-control semiconductor switching device and to a power input end of said control signal supply circuit while connected to said third power supply voltage; and a fourth externally leading-out terminal connected to the other end of said load-control semiconductor switching device while connected to a load.

7. The semiconductor circuit component according to claim 3, wherein
said drive-control semiconductor switching device has one end connected to a power input end of said control signal supply circuit while the power input end is connected to said third power supply voltage through the other end of said drive-control semiconductor switching device so that, when a drive voltage is supplied from said voltage supply circuit to said drive-control semiconductor switching device to drive said drive-control semiconductor switching device, the third power supply voltage is supplied from said drive-control semiconductor switching device to said control signal supply circuit.

8. The semiconductor circuit component according to claim 7, further comprising:
a first externally leading-out terminal connected to the other end of said drive-control semiconductor switching device and to one end of said load-control semiconductor switching device while connected to said third power supply voltage;

a second externally leading-out terminal connected to a ground end of the voltage supply circuit while connected to the ground through said switch unit;

a third externally leading-out terminal connected to the other end of said load-control semiconductor switching device while connected to said load; and a fourth externally leading-out terminal connected to a ground end of said control signal supply circuit while connected to the ground.

9. A semiconductor circuit component capable of being driven when an externally provided switch unit is turned on to supply a first power supply voltage to said semiconductor circuit component,
said semiconductor circuit component comprising:
a load-control semiconductor switching device with a control terminal;
a control signal supply circuit for supplying a control signal to said control terminal of said load-control semiconductor switching device to drive said load-control semiconductor switching device; and
a drive control circuit for controlling the control signal supply circuit in a manner so that, only when said switch unit is turned on, a second power supply voltage is supplied from said drive control circuit to said control signal supply circuit to make said control signal supply circuit output the control signal, wherein
said drive control circuit has first and second drive control circuits, and
said switch unit has first and second switch units, and wherein
said first drive control circuit is connected in series with said first switch unit between the first and second power supply voltages,
said second drive control circuit is connected in series with said second switch unit between said first and second power supply voltages,
so that only when said first and second switch units are turned on, at least one of the first and second power supply voltages is supplied from said drive control circuit to said control signal supply circuit.

10. The semiconductor circuit component according to claim 9, wherein
said first drive control circuit comprises:
a first drive-control semiconductor switching device with a control terminal, and
a first voltage supply circuit for supplying a drive voltage to said control terminal of said first drive-control semiconductor switching device, upon turning on said first switch unit, by supplying one of the first and second power supply voltages to said first voltage supply circuit,
said second drive control circuit comprises:
a second drive-control semiconductor switching device with a control terminal, and
a second voltage supply circuit for supplying a drive voltage to said control terminal of said second drive-control semiconductor switching device, upon turning on said second switch unit, by supplying another one of the first and second power supply voltages to said second voltage supply circuit, and wherein
when said first and second drive-control semiconductor switching devices are supplied with drive voltages from said first and second voltage supply circuits respectively, the first and second power supply voltages are supplied from said first and second drive-control semiconductor switching devices to said control signal supply circuit.

11. The semiconductor circuit component according to claim 10, wherein
said first voltage supply circuit comprises:
a first voltage dividing circuit for dividing the one of the first and second power supply voltages supplied through said first switch unit, and
a first voltage suppressing circuit for suppressing a partial voltage into a predetermined value, the partial voltage being obtained by said first voltage dividing circuit; and
said second voltage supply circuit comprises:
a second voltage dividing circuit for dividing the other of the first and second power supply voltages supplied through said second switch unit, and
a second voltage suppressing circuit for suppressing a partial voltage into a predetermined value, the partial voltage being obtained by said second voltage dividing circuit.

12. The semiconductor circuit component according to claim 10, wherein
said first drive-control semiconductor switching device is formed to have one end connected to a ground end of said control signal supply circuit while said ground end is connected through the other end of said first drive-control semiconductor switching device to one of the first and the second power supply voltages, and
said second drive-control semiconductor switching device is formed to have one end connected to a power input end of said control signal supply circuit while said power input end is connected to an other one of the first and second power supply voltages through the other end of said second drive-control semiconductor switching device, so that when a drive voltage is supplied from said first voltage supply circuit to said first drive-control semiconductor switching device to drive said first drive-control semiconductor switching device, and when a drive voltage is supplied from said second voltage supply circuit to said second drive-control semiconductor switching device to drive said second drive-control semiconductor switching device, the first and second power supply voltages are supplied from said first and second drive-control semiconductor switching devices to said control signal supply circuit.

13. The semiconductor circuit component according to claim 12, further comprising:

a first externally leading-out terminal connected to a power input end of said first voltage supply circuit while connected to one of said first and second power supply voltages through said first switch unit;

a second externally leading-out terminal connected to a ground end of said second voltage supply circuit while connected to an other one of said first and second power supply voltages through said second switch unit;

a third externally leading-out terminal connected to the other end of said second drive-control semiconductor switching device and to one end of said load-control semiconductor switching device while connected to the one of the first and second power supply voltages;

a fourth externally leading-out terminal connected to the other end of said load-control semiconductor switching device while connected to said load; and a fifth externally leading-out terminal connected to the other end of said first drive-control semiconductor switching device while connected to the ground.

14. A semiconductor circuit component capable of being driven when an externally provided switch unit is turned on to supply a first power supply voltage to said semiconductor circuit component, comprising:

switching means for switching power to a load;

control signal supply means for supplying a control signal to a control terminal of said switching means, and wherein the control signal supply means is coupled to a third power supply voltage; and drive control means for controlling a supply of a second power supply voltage to the control signal supply means only when the switch unit is turned on, and for making said control signal supply means output the control signal, wherein said second power supply voltage is less than said third power supply voltage and said drive control means further comprises a drive control switching means with a control terminal and a voltage suppressing means disposed between the control terminal of the drive control switching means and the second power supply voltage.

15. A method for driving a semiconductor circuit component, comprising:

turning on a switch unit to supply a first power supply voltage to said semiconductor circuit component;

supplying a second power supply voltage through a semiconductor switching device having a control terminal to a control signal supply circuit coupled to a third power supply voltage, only when said switch unit is turned on, the second power supply voltage is supplied to make the control signal supply circuit output a control signal, wherein said second power supply voltage is less than said third power supply voltage;

suppressing a voltage between the control terminal and the second power supply voltage;

supplying the control signal to a load-control semiconductor switching device; and switching power to a load based on the control signal.

* * * * *